United States Patent
Kloth

[11] 4,035,046
[45] July 12, 1977

[54] MINIATURE ELECTRICAL CONNECTOR FOR PARALLEL PANEL MEMBERS

[75] Inventor: James Albert Kloth, North St. Petersburg, Fla.

[73] Assignee: AMP Incorporated, Harrisburg, Pa.

[21] Appl. No.: 649,438

[22] Filed: Jan. 15, 1976

[51] Int. Cl.² .................................. H01R 9/04
[52] U.S. Cl. .................. 339/17 CF; 174/52 FP; 339/176 MP
[58] Field of Search ..... 339/17 CF, 176 MP, 198 J, 339/206 R, 207 R, 207 S, 208–209, 210 R, 210 M; 174/52 FP

[56] References Cited
U.S. PATENT DOCUMENTS

| | | |
|---|---|---|
| 3,340,439 | 9/1967 | Henschen et al. ......... 339/17 CF X |
| 3,771,109 | 11/1973 | Bruckner et al. .......... 339/17 CF X |
| 3,873,173 | 3/1975 | Anhalt ..................... 339/17 CF |
| 3,951,491 | 4/1976 | Mysiak .................... 339/17 CF |
| 3,953,101 | 4/1976 | Palecek .................. 339/17 CF X |

Primary Examiner—Roy Lake
Assistant Examiner—Howard N. Goldberg
Attorney, Agent, or Firm—Robert W. Pitts; William J. Keating; Frederick W. Raring

[57] ABSTRACT

A miniature electrical connector for establishing electrical contact between terminal pads on a ceramic chip substrate carrier to terminal pads on a printed circuit board is disclosed. The connector comprises a frame like member having a plurality of spring contacts located in cavities on the inner edge of the frame member. Individual stamped and formed contacts or contacts mounted on a polymeric film are utilized. A removable cover secures the substrate carrier to the frame member.

13 Claims, 11 Drawing Figures

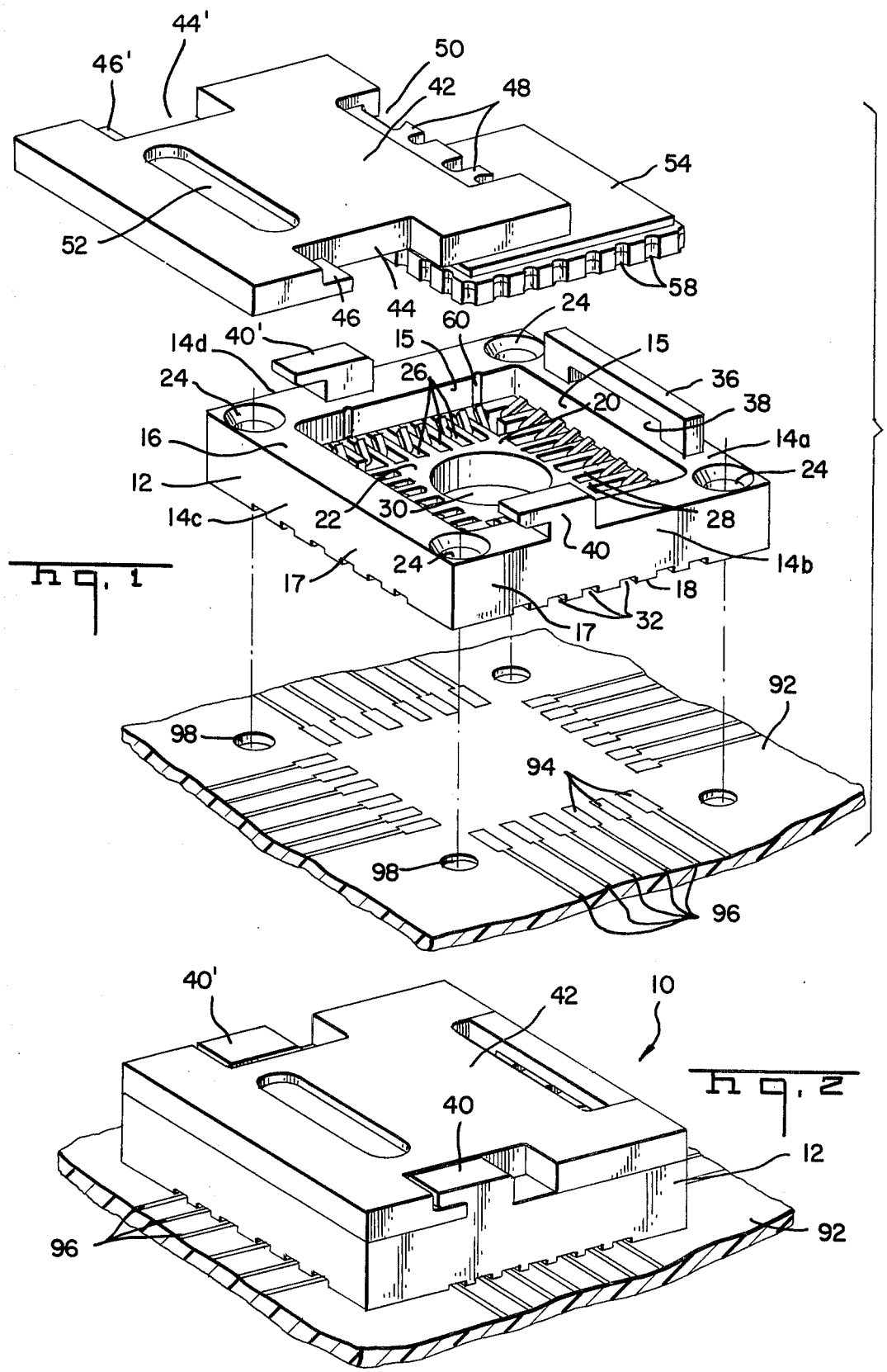

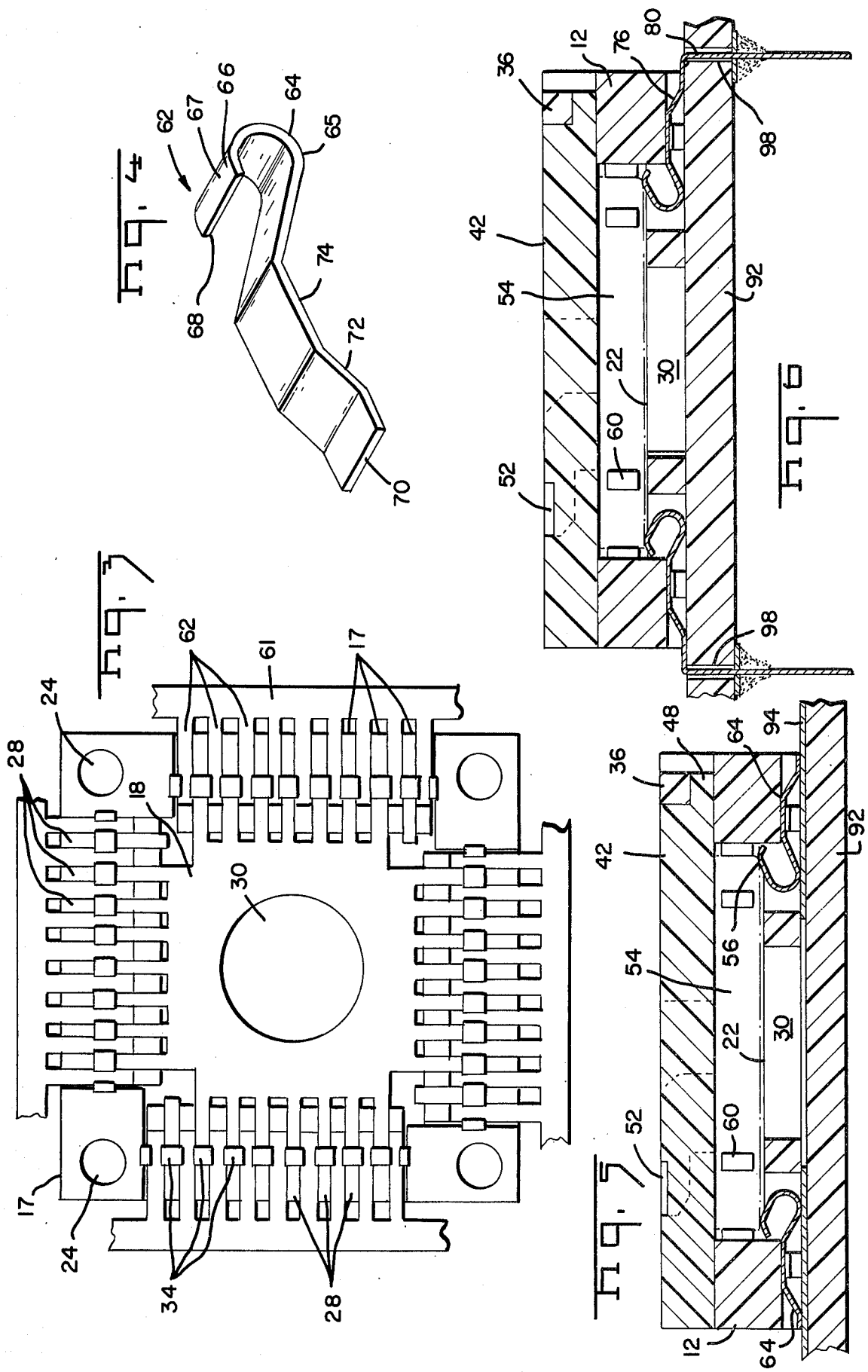

MINIATURE ELECTRICAL CONNECTOR FOR PARALLEL PANEL MEMBERS

BACKGROUND OF THE INVENTION

1. Field of the Invention

This invention relates to an electrical connector for use in connecting an integrated circuit element having conductive terminal pads on one surface with a printed circuit board also having conductive terminal pads. More specifically, this invention relates to an electrical connector having an insulating housing for mounting the integrated circuit element on a printed circuit board. The integrated circuit element with which this connector is to be used comprises an integrated circuit chip mounted on a substrate carrier. This particular substrate carrier is rectangular and has a number of terminal pads located around its edges. This invention utilizes resilient spring contacts to interconnect the terminal pads on the substrate carrier and on the printed circuit board.

2. Description of the Prior Art

A number of connector assemblies for connecting leadless integrated circuit elements to a printed circuit board are known in the prior art. One example can be found in U.S. Pat. No. 3,873,173. That patent shows a connector assembly which utilizes spring contacts to connect opposed terminal pads on adjacent sides of a circuit element and a printed circuit board. The geometry of various integrated circuit elements is not standarized and each individual connector assembly must be adapted to the particular geometry of the circuit element. Such geometrical differences can result in changes in the connector assembly which are not merely matters of design. These changes are conceptual changes offering different methods of handling the relatively small integrated circuit elements and printed circuit boards.

The instant invention comprises an insulating housing member and contact terminal means positioned in the insulated housing. The instant invention employs a single insulating housing which can be employed with several alternative terminal means.

The instant housing is specifically intended for use with contact terminal mounted on a carrier strip so that they can be easily handled in multiples. One embodiment of this invention comprises individual contact terminals mounted on a polymeric film such as that disclosed in U.S. Pat. No. 3,960,423 filed Oct. 2, 1974.

BRIEF SUMMARY OF THE INVENTION

This invention comprises a connector assembly for interconnecting a leadless integrated circuit element mounted on a substrate carrier with terminal pads on a printed circuit board. The connector assembly employs an insulating housing mounted on a printed circuit board. The substrate carrier is then positioned in the insulating housing. A removable cover is used to enclose the substrate carrier. Contact terminal means are employed to connect corresponding terminal pads on the substrate carrier and on the printed circuit board. In one form these contact terminals are opposed spring members which establish contact between oppositely facing terminal pads. In another embodiment they are a combination spring member and soldered terminal for interconnecting terminal pads which are not on adjacent sides of the substrate carrier and printed circuit board.

Among the objects of the invention is the utilization of an insulating housing which allows the contact terminals to be handled in strip form. A plurality of contact terminals can be attached to a carrier and shaped as a unit rather than individually. With the relatively small contacts necessary for this assembly, handling a plurality of contacts in strip form greatly simplifies the construction of the connector assembly. Ease of fabrication is, therefore, one of the principal objectives of this invention.

Another object of this invention is the utilization of an insulating housing member which can be used with a number of different types of contact terminals. This allows the same housing to be used for numerous substrate carrier-printed circuit board configurations. For example, a terminal which extends through the printed circuit board might be required in one instance while a terminal which establishes contact with pads on the top of the printed circuit board would be needed in another.

Another object of this invention is to employ an insulated housing which can be permanently mounted on the printed circuit board and which provides a mount for the substrate carrier. The substrate carrier should be removable from the housing member so that an integrated circuit element could be replaced when necessary. A removable cover is provided to retain the substrate carrier in the housing. An appropriate indexing means are provided to ensure proper alignment of corresponding terminal pads.

BRIEF DESCRIPTION OF THE DRAWING

FIG. 1 is an exploded perspective view showing the cover, housing, substrate carrier, and the printed circuit board in their relative relationships.

FIG. 2 shows the assembly of all components mounted on the printed circuit board.

FIG. 3 shows the bottom surface of the housing and terminals on a carrier strips.

FIG. 4 shows a single stamped and formed terminal.

FIG. 5 shows the stamped and formed contact mounted in the connector.

FIG. 6 shows a stamped and formed contacts mounted in the housing for use in a through the board application.

DETAILED DESCRIPTION OF THE INVENTION

Figure 11:
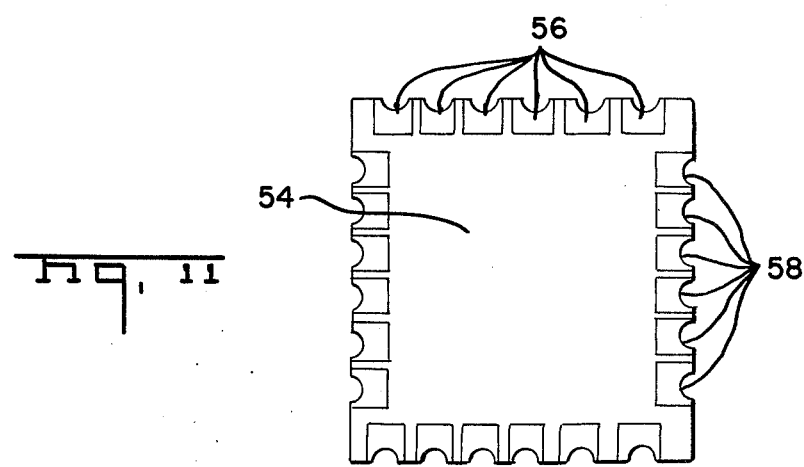
FIG. 11 shows terminal pads on the lower surface of a substrate carrier.

Substrate carrier 54 is a generally rectangular member which serves as a mount for an integrated circuit element or chip. Substrate carrier 54 contains a number of terminal pads 56 (see FIG. 11) which are disposed about the edges of one surface of substrate surface 54. These terminal pads are made of gold to ensure good contact. The substrate carrier contains a number of notches 58 extending into the edges of substrate carrier 54 at the location of each terminal pad 56.

Interconnection of terminal pads 56 with a similar array of terminal pads 94 located on a printed circuit board is accomplished by utilizing connector 10 which embodies this invention. With this invention, the substrate carrier is enclosed in an insulating housing and the housing 12 is then mounted on a printed circuit board. By using appropriate terminals, contact may be made with terminal pads 94 on an adjacent side of the printed circuit board 92. Another terminal may be utilized to establish contact with terminal pads on the opposite surface of a printed circuit board. In this later configuration, (FIG. 6) terminals extend through holes 98 in the printed circuit board and are then soldered to terminal pads on the lower surface of the printed circuit board. Each of the embodiments relies on a spring contact between the printed circuit board and the terminal pads on the substrate carrier. Either a spring contact or a soldered contact may be utilized with the terminal pads 94 on the printed circuit board.

Connector 10 comprises an insulating housing 12 made of any rigid insulating thermoset plastic, such as RYTON —a trademark of Phillips Petroleum. Housing 12 in FIG. 1 is generally rectangular and has four bar-like sides 14 a, b, c, and d which form a frame. This frame has first and second parallel faces which form the bottom surface 18 and the top surface 16 respectively of housing 12. A rectangular central compartment 20 is located within the four sided frame and has a surface 22 which is parallel to and located between the planes of faces 16 and 18. Central surface 22 serves as a panel supporting surface. Central compartment 20 is generally the same size as substrate carrier 54 and the substrate carrier can be positioned in central compartment 20 against surface 22. Four holes 24 are located at the corners of the frame like housing 12. These holes extend from the first to the second face and serve as clamping means. A screw, rivet, or eyelet can be inserted into each hole to affix housing 12 to printed circuit board 92. Housing 12 is attached to a printed circuit board by positioning the bottom or first face 18 against the printed circuit board.

A plurality of cavities 26 extend between panel-supporting surface 22 and first face 18. These cavities are separated by ribs 28 which extend inwardly from the inner edge 15 of the four sided frame. These cavities are spaced apart by the same distance as the spacing of substrate carrier terminal pads 56 and printed circuit board terminal pads 94. A plurality of grooves 32 are located in first face 18 and extend from the inner edge 15 to the outer edge 17 of face 18. These grooves are in alignment with cavities 26. Panel supporting surface 22 has a hole 30 located in the center. This hole is large enough so that a probe or prod may be inserted, from beneath, to remove substrate carrier 54.

The second face 16 has a plate-like member 36 extending upwardly from side 14 a. This plate-like member has an enlongated slot 38 which extends parallel to side 14 a. One edge of slot 38 is formed by the top surface of side 14 a. Sides 14 b and 14 d each have upright L-shaped member 40, 40' facing away from side 14 a. These L-shaped members are in alignment and are adjacent to side 14 c. Cover member 42 is generally rectangular in shape and is intended to fit on second face 16. Rectangular recesses 44 and 44' extend inwardly upon opposite sides of cover 42. These recesses are at least as long as L-shaped member 40 and 40'. Flanges 46 and 46' extend into recessess 44 and 44'. The thickness of flanges 46 and 46' is less then thickness of cover 42 and is generally equal to the gap formed by L-shaped members 40 and 40'. A number of tabs 48 are located in insert 50 along one edge of cover 42. The thickness of these tabs is approximately equal to the height of slot 38. Cover 42 has a grip 52 in its top surface. Cover 42 is attached to housing 12 by placing the cover on the second face 16 of the housing. Recesses 44 and 44' are aligned with L-shaped member 40, 40', and tabs 48 are aligned with slot 38. By applying pressure to grip 52, cover 42 can be pushed toward plate-like member 36. Flanges 46 and 46' will engage L-shaped member 40, 40' while tabs 48 are then engaged by slot 38 to secure cover 42 to housing 12. Tabs 48 have protrusions at the tip of their outer edges. Said protrusions cause tab 48 to be deflected inwardly by the inner faces of slot 38, springing outward again after passing through slot 38 thereby latching cover in closed position. Cover 42 must be securely latched to withstand shock and vibration effects. Several alternate contact means can be employed with housing 12. Individual stamped and formed terminals 62, best shown in FIG. 4, can be positioned in cavities 26 to establish electrical contact between terminal pads 94. These contacts consist of a conductive material having resilient spring like characteristics such as Phosphor Bronze or Berylium Copper. The stamped and formed contacts have a C-shaped contact portion having a first convex surface 64 and an opposed second convex surface 66. Contact points 65 and 67 are established on the terminal. Second convex surface 66 is located adjacent to one end 68 of terminal 62. Second convex surface 66 normally extends beyond panel supporting surface 22 while the other convex surface 64 normally extends beyond first face 18. By positioning a printed circuit board on face 18 and a substrate carrier against surface 22, a spring contact can be established between these two panel-like members. First convex surface 64 is located between intermediate ends 68 and 70 of terminal 62. Shank 72 is located between convex surface 64 and end 70. Shank 72 has an indentation 74 between surface 64 and end 70. Shank 72 can be positioned in groove 32 along first face 18 with end 70 normally extending beyond face 18. The portions of face 18 or ribs 28 between adjacent grooves 32 can be deformed at points 34 which are in alignment with indentations 74 so that each terminal can be secured in grooves 32.

Rather than handling each terminal 62 individually, all of the terminals along any one side of the housing can be handled as a unit. The second end 70 on each terminal can be attached to an integral carrier strip 61 shown in FIG. 3. When the terminals are positioned in grooves 32, ribs 28 are deformed to secure terminals 62 in their correct locations. The terminals can then be severed from carrier strip 61 along outer edge 17 of housing 12, creating second-end 70.

An alternate embodiment utilizing a stamped and formed terminal is necessary when the terminal must extend through holes 98 in a printed circuit board 92 so that access can be gained to terminal pads located on the opposite face of the printed circuit board. This embodiment is shown in FIG. 6. The same C-shaped spring contact can be utilized along with solder post 80 extending perpendicular to the shank 72 in terminal 62. The spring contact with terminal pads 56 on substrate carrier 54 is retained but a soldered contact is now necessary with terminal pads located on the printed circuit board.

Figure 7:
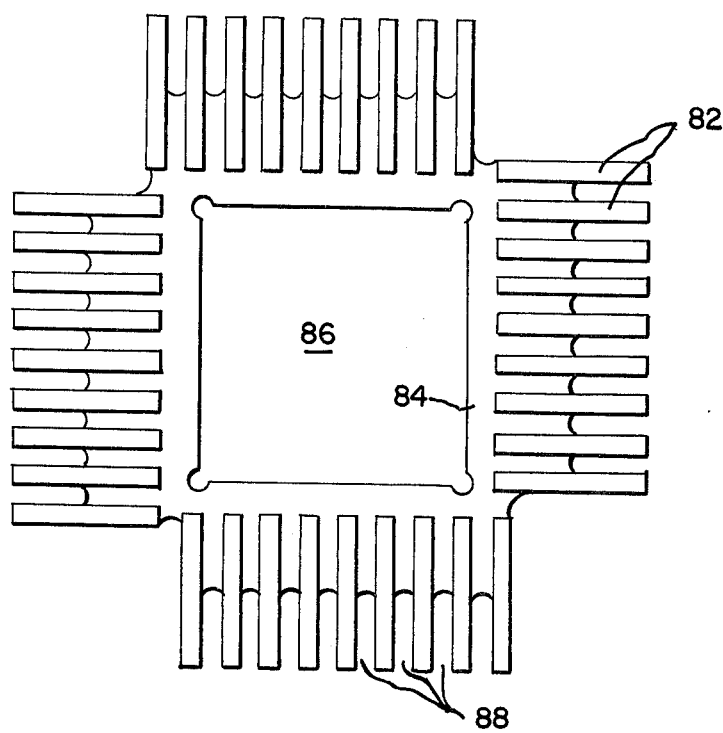
FIG. 7 shows terminals mounted on a polymeric film.
Figure 8:
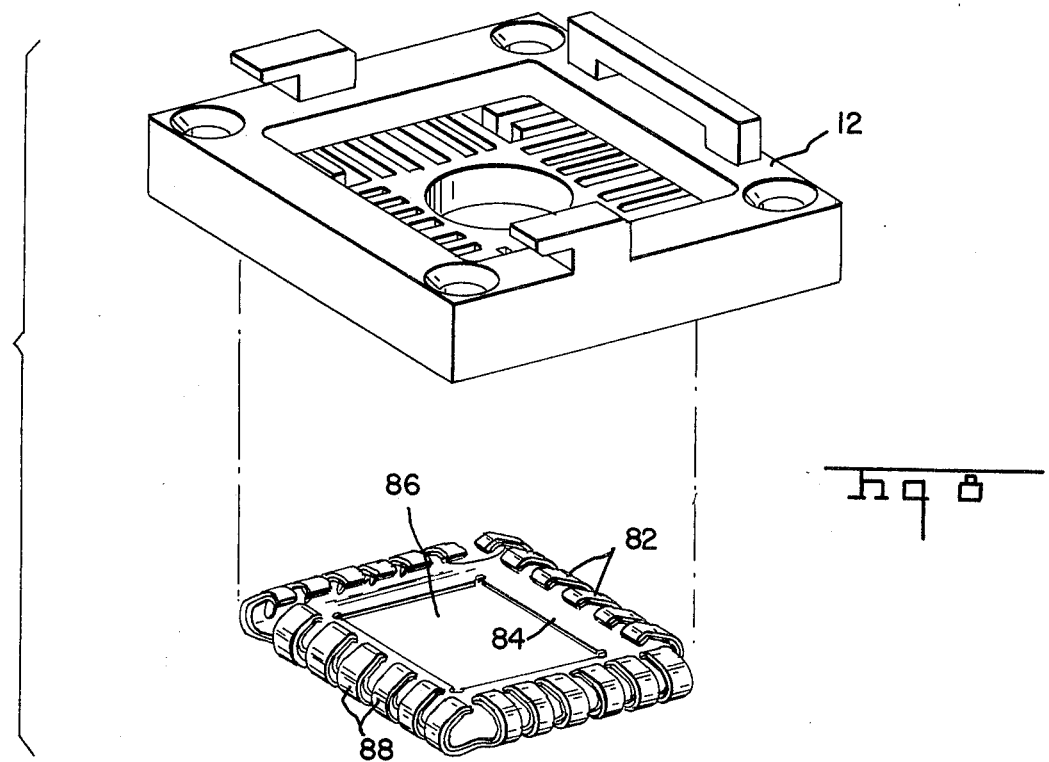
FIG. 8 shows contact terminals mounted on a polymeric film which have been formed into C-shaped contacts.
Figure 9:
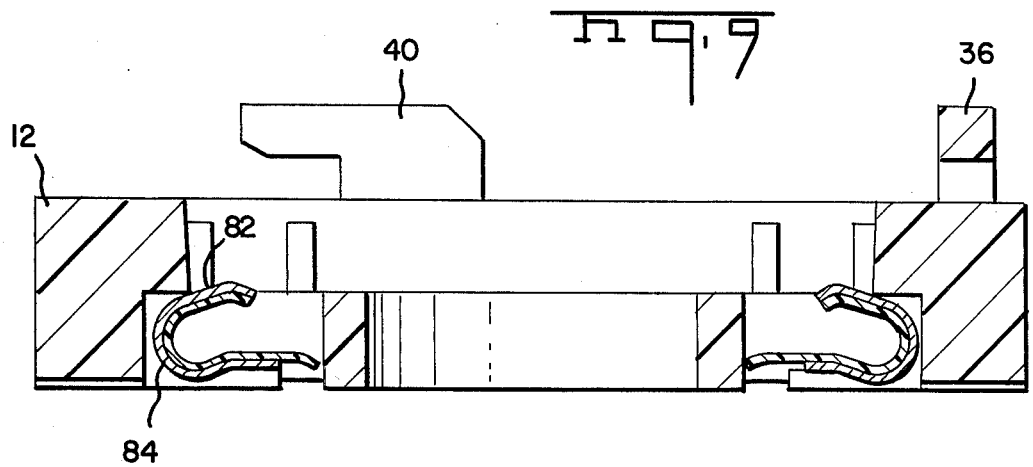
FIG. 9 is a side view showing terminals on a polymeric film located in a housing.

Rather than using individual stamped and formed terminals, the electrical contact means can comprise a plurality of metallic spring conductors bonded to a polymeric film as shown in FIG. 7-9. These terminals can be formed by selectively etching a laminate comprising a layer of metal and a polymeric film such as Kaption (a trademark of DuPont Company). A plurality of contact terminals 82 mounted on polymeric film 84 can be formed with the terminals extending transverse to each of the four edges of a rectangular piece of polymeric film. The terminals can then be formed into a C-shaped spring with opposite convex surfaces similar to that used with individual stamped and formed contacts.

When used with insulating housing 12, a portion 88 of the polymeric film between adjacent terminals 82 must be removed. Material must be removed from between adjacent terminals so that the terminals may be inserted into the cavities 26 leaving room for intermediate ribs 28. When the film mounted terminals 82 are utilized, the ends of the individual terminals face inwardly whereas the ends of individual stamped and formed terminals 62 face outwardly. This change in the orientation of the C-shaped contact portion does not effect the electrical properties of the connector.

Assembly of this electrical connector includes the following steps many of which can be best understood by referring to FIG. 3. Contact terminals are loaded into housing 12 by placing the housing with first on top. The terminals are then placed into individual cavities. When using film mounted terminals 82, no other terminal insertion operations are necessary. When individual stamped and formed terminals are used, the preferable method of handling these terminals is to position all of the terminals on any one side within the cavities by means of an integral carrier strip. Intermediate ribs 28 are deformed so that the terminals can be held in grooves 32 and cavities 26. The carrier strip is then severed along the outer edge 17 of housing 12. Housing 12 can now be rotated with first face 18 now becoming the bottom surface of housing 12. Housing 12 is next clamped on a printed circuit board with cavities 26 in alignment with an array of terminal pads 94 on the printed circuit board. A substrate carrier 54 can then be placed in central opening 20 with the terminal pads 56 aligned with cavities 26. Several index tabs 60 are located along the inner edge 15 of each side 14. Notches 58 on substrate carrier 54 engage these indexing tabs to ensure proper alignment of a substrate carrier. Cover 42 can now be positioned on upper surface 16 and locked into place as previously discussed.

Figure 10:
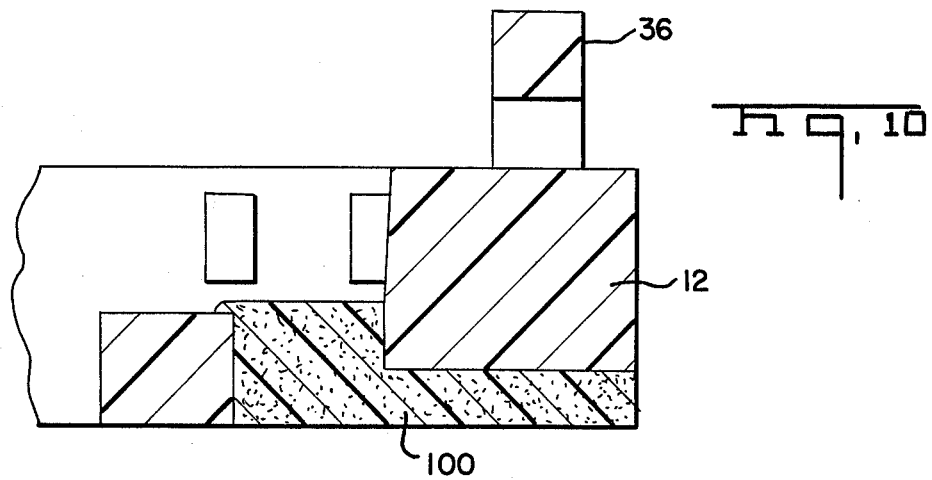
FIG. 10 is a side view of an embodiment in which a conductive elastomeric fills a cavity in a housing.

FIG. 10 shows a versatility of the housing described in this application. In this figure the cavity has been filled with a conductive elastomer 100. When the housing is mounted on a printed circuit board and a substrate carrier is mounted in the housing the resilient spring action of the conductive elastomer establishes electrical contact between corresponding terminal pads. It should therefore be evident that the essence of this invention can be employed with a number of different embodiment. Therefore, those embodiments specifically illustrated together with other embodiment differing only in detail are covered by the following claims.

What is claimed is:

1. An electrical connector for connecting a rectangular array of discrete terminal pads spaced-apart by a predetermined distance on a ceramic chip substrate carrier to corresponding terminal pads also spaced-apart by said predetermined distance in a similar rectangular array on a printed circuit board, said connector comprising:

a generally rectangular insulating supporting housing member, said member having first and second opposed, generally flat, parallel faces extending around the periphery of said housing member, a substrate carrier support surface which is parallel to said first and second parallel faces and is located between said faces, a plurality of cavities extending between said first face and said substrate carrier support surface, said cavities being generally spaced-apart by said predetermined distance, a plurality of ribs, one of said ribs extending between each pair of adjacent cavities, said ribs extending transverse to said first face and said substrate carrier support surface, a plate-like member on one side of said rectangular housing member extending transverse to said second face, an elongated slot in said plate-like member, one edges of said slot comprising a portion of said second face, two L-shaped members extending upwardly from said second face, said L-shaped members being on opposed sides of said housing member, said L-shaped members facing away from said elongated slot, a plate-like cover member, said cover member having recesses extending inwardly from opposed sides and a flange extending parallel to the plane of said cover member and into each of said recesses, tabs extending transverse to a third side of said cover member, said third side extending between said opposed sides of said cover member, contact terminal means located in each of said cavities, said terminal means extending between said first face and said substrate carrier support surface, whereby said ceramic chip substrate carrier can be positioned on said carrier support surface and said first face can be positioned on said printed circuit board with said terminal means establishing electrical contact between corresponding terminal pads on said ceramic chip substrate carrier and said printed circuit board and with said cover member positioned against said second face with said tabs engaging said slot and said flanges engaging said L-shaped members.

2. An electrical connector as set forth in claim 1, wherein said periphery and said substrate carrier support surface from a rectangular compartment, said compartment having substantially the same dimensions as said ceramic chip substrate carrier so that said substrate carrier may be contained by said compartment and said cover member.

3. An electrical connector as set forth in claim 2 wherein said compartment has a plurality of indexing members which register wit corresponding indexing means on said ceramic chip substrate carrier to position said substrate carrier for proper alignment of said terminal pads and said contact terminals.

4. An electrical connector as set forth in claim 1 wherein said substrate carrier support surface has a hole therein so that an appropriate probe can be inserted in said said hole to remove said substrate carrier from said compartment.

5. An electrical connector as set forth in claim 1 wherein said housing member has clamping means located on the periphery thereof for securing said housing member to said printed circuit board with said first face against said printed circuit board with said periphery extending around said terminal pads located on said printed circuit board.

6. An electrical connector as set forth in claim 1 wherein a plurality of parallel grooves extend along said first face, said grooves being in alignment with said cavities.

7. An electrical connector for connecting a plurality of discrete spaced-apart terminal pads on a first panel-like member to a corresponding plurality of terminal pads on a second panel-like member, said connector comprising:

an insulating housing having a first face,
a plurality of parallel grooves extending across said first face,
a plurality of ribs separating said grooves,
a plurality of individual electrical terminals, said terminals each having a contact portion and a shank portion, said terminals being located with said shank portions lying in said grooves between a pair of said ribs, and
deformed portions on the top of said ribs retaining said shank portion in said grooves, said shank portions having been inserted into said grooves prior to deformation of said top portions,
whereby, said connector can be positioned with each of said contact portions interconnecting corresponding spaced-apart terminal pads on said first and said second panel-like members.

8. An electrical connector as set forth in claim 7 wherein said insulating housing comprises a frame member extending around a central panel supporting surface, said first face being located on said frame member, said central panel supporting surface having a plurality of cavities therein, said cavities communicating with said grooves said contact portions of said terminals being located in said cavities.

9. An electrical connector as set forth in claim 8 wherein said first face extends on four sides of said central panel supporting surface with grooves located on each of said four sides of said central panel supporting surface.

10. An electrical connector as set forth in claim 8 wherein said contact portions comprise spring members normally extending beyond said first face and said panel supporting surface when said spring members are in an unbiased state.

11. An electrical connector as set forth in claim 7 wherein said contact portions extend from one end of said shank portions and solder posts extend from the opposite end of said shank portion.

12. An electrical connector as set forth in claim 7 wherein the central portion of said terminal shank portion abuts the bottom of said grooves in the vicinity of said deformed portions, and said shank diverges from said first face on both sides of said central shank portion.

13. An electrical connector for use with a leadless integrated circuit element mounted on a substrate carrier with terminal pads located around the periphery of said substrate carrier, said connector comprising:

a frame member and a plurality of electrical terminals located in said frame member, A. said frame member comprising:
a central surface for supporting said substrate carrier,
a plurality of cavities in said central surface,
a first face reversely oriented relative to said central surface,
a plurality of ribs radiating outwardly around said frame member, said ribs being located on said first face,
a plurality of grooves formed by said ribs, said grooves communicating with said cavities, B. said electrical terminals each comprising:
a contact portion and a shank portion, said contact portions being located within said cavities and said shank portions being located within said grooves and restrained therein by portions of said ribs deformed subsequent to positioning said shank portions in said grooves, whereby, electrical contact can be established between said terminal pads on said substrate carrier and said contact portions on said terminals when said substrate carrier is positioned on said central surface and said electrical connector can be mounted on a printed circuit board or the like.

* * * * *